United States Patent
Chou

(10) Patent No.: US 7,537,867 B2
(45) Date of Patent: May 26, 2009

(54) METHOD FOR MANUFACTURING COLOR FILTER

(75) Inventor: Ching-Yu Chou, Hsinchu (TW)

(73) Assignee: ICF Technology Co., Ltd., Hsinchu (TW)

( * ) Notice: Subject to any disclaimer, the term of this patent is extended or adjusted under 35 U.S.C. 154(b) by 298 days.

(21) Appl. No.: 11/432,969

(22) Filed: May 12, 2006

(65) Prior Publication Data
US 2006/0284956 A1  Dec. 21, 2006

(30) Foreign Application Priority Data
Jul. 8, 2005  (CN) ............... 2005 1 0035916

(51) Int. Cl.
*G02B 5/20* (2006.01)
(52) U.S. Cl. ............................ 430/7; 347/107
(58) Field of Classification Search ............. None
See application file for complete search history.

(56) References Cited

U.S. PATENT DOCUMENTS 6,468,702 B1 * 10/2002 Yi et al. ................. 430/7
6,887,631 B2   5/2005 Kiguchi et al.
2003/0076572 A1 * 4/2003 Kawase .................. 359/245

FOREIGN PATENT DOCUMENTS

| CN | 02101000.5 | 4/2005 |
| KR | 2001-75430 | 8/2001 |
| KR | 2005-68507 | 7/2005 |

* cited by examiner

*Primary Examiner*—John A. McPherson
(74) *Attorney, Agent, or Firm*—Frank R. Niranjan

(57) ABSTRACT

A method for manufacturing a color filter includes the steps of: forming an organic black photoresist layer (304) on a transparent substrate (300); exposing the organic black photoresist layer using a photo-mask; developing the organic black photoresist layer to form an organic black matrix (3041) on the transparent substrate; forming a positive photoresist layer (306) on the transparent substrate thereby covering the organic black matrix with the positive photoresist layer; irradiating a surface of the transparent substrate facing away from the positive photoresist layer so as to expose the positive photoresist layer; developing the positive photoresist layer to form a plurality of banks (3061) on the organic black matrix; injecting ink into spaces defined by the banks and the organic black matrix using an ink-jet device; and solidifying the ink.

10 Claims, 11 Drawing Sheets

METHOD FOR MANUFACTURING COLOR FILTER

BACKGROUND

1. Technical Invention

The present invention generally relates to color filters, and more particularly to a method for manufacturing a color filter.

2. Discussion of Related Art

At present, liquid crystal displays (LCDs) are used in various fields, such as for notebook PCs, mobile phones, desktop monitors, and digital cameras, because of their excellent characteristics, such as low weight, thinness, and low power consumption. The liquid crystal display includes a color filter for displaying color images. For the device to have color capability, each pixel is aligned with a color area, typically red, green, or blue, of a color filter array. Depending upon the image to be displayed, one or more of the pixel electrodes is energized during display operation to allow full light, no light, or partial light to be transmitted through the color filter area associated with that pixel. The image perceived by a user is a blend of colors formed by the transmission of light through adjacent color filter areas.

Referring to FIG. 1, a flow chart of a conventional ink-jet method for manufacturing a color filter is shown. The method mainly includes the steps of: forming a metallic material layer on a transparent substrate and a first photoresist layer on the metallic material layer; exposing the first photoresist layer using a photo-mask; developing the first photoresist layer to form a patterned photoresist matrix; etching the metallic material layer to form a black matrix and removing the residual first photoresist layer; forming a second photoresist layer on the transparent substrate thereby covering the black matrix with the second photoresist layer; irradiating a surface of the transparent substrate facing away from the second photoresist layer so as to expose the second photoresist layer; developing the second photoresist layer to form a plurality of banks on the black matrix; injecting ink into spaces defined by the banks and the black matrix using an ink-jet device; and solidifying the ink.

Referring to FIGS. 2 to 9, more-detail steps of the conventional ink-jet method are shown. Referring to FIG. 2, a transparent substrate 100 is provided. A metallic material layer 102 and a first photoresist layer 104 are formed on the transparent substrate 100 in turn. The metallic material layer 102 is a chromium film layer or a chromium alloy film layer and is generally formed by evaporation or sputtering process.

Referring to FIG. 3, the first photoresist layer 104 is exposed using a photo-mask (not shown) and then developed to form a patterned photoresist matrix 1041. Therefore, the pattern of the photo-mask is transferred to the patterned photoresist matrix 1041.

Referring to FIG. 4, the metallic material layer 102 is etched to form a black matrix 1021 on the transparent substrate 100, and then the patterned photoresist matrix 1041 is totally removed. Therefore, the pattern of the patterned photoresist matrix is transferred to the black matrix 1021.

Referring to FIG. 5, a second photoresist layer 106 is formed on the transparent substrate 100 thereby covering the black matrix 1021 with the second photoresist layer 106. U.V. (ultraviolet) radiation emitted from an ultraviolet light source 112 is then transmitted onto a surface of the transparent substrate 100 facing away from the second photoresist layer 106 so as to expose the second photoresist layer 106.

Referring to FIG. 6, the photoresist layer 106 is developed to form a plurality of banks 1061 on the black matrix 1021. Spaces are defined by the banks 1061 and the black matrix 1021.

Referring to FIGS. 7 to 8, an ink-drop 108 of a desired color in a micrometer-range size is injected into the spaces defined by the banks 1061 the black matrix 1021, and the ink-drops 108 are mixed together in the spaces to form ink 110.

Referring to FIG. 9, the ink 110 is dried or cross-linked or both by a solidifying device, such as a heating device or a light-emitting device to form a flat color layer 114. The flat color layer 114 may be red for example. Correspondingly, other color layers, such as blue-color layer and green-color layer may be formed adjacently to the color layer 114.

In the conventional method for manufacturing a color filter, for transferring the pattern from the photo-mask to the black matrix 1021, firstly the pattern of the photo-mask is transferred to the first photoresist layer 104 to form the patterned photoresist layer 1041. Secondly the pattern of the patterned photoresist layer 1041 is transferred to the metallic material layer 102 to form the black matrix 1021. Therefore, the pattern precision of the black matrix 1021 may be reduced due to the two-step nature of the process of forming the black matrix 1021. The precision of the banks 1061 and the color layer 114, etc. may also be reduced too. Moreover chromium is harmful to the environment as it is a heavy metal and is toxic to living organisms.

What is needed, therefore, is a method for manufacturing a color filter with high pattern precision for the black matrix.

SUMMARY

A method for manufacturing a color filter according to one preferred embodiment includes the steps of: forming an organic black photoresist layer on a transparent substrate; exposing the organic black photoresist layer using a photo-mask; developing the organic black photoresist layer to form an organic black matrix on the transparent substrate; forming a positive photoresist layer on the transparent substrate thereby covering the organic black matrix with the positive photoresist layer; irradiating a surface of the transparent substrate facing away from the positive photoresist layer so as to expose the positive photoresist layer; developing the positive photoresist layer to form a plurality of banks on the organic black matrix; injecting ink into spaces defined by the banks and the organic black matrix using an ink-jet device; and solidifying the ink.

A method for manufacturing a color filter according to another preferred embodiment includes the steps of: defining a plurality of grooves in a surface of a transparent substrate; applying a black organic material into the plurality of grooves to form an organic black matrix; forming a positive photoresist layer on the transparent substrate, thereby covering the organic black matrix with the positive photoresist layer; irradiating a surface of the transparent substrate facing away from the positive photoresist layer so as to expose the positive photoresist layer, developing the positive photoresist layer to form a plurality of banks on the organic black matrix; injecting ink into spaces defined by the banks and the organic black matrix using an ink-jet device; and solidifying the ink.

Compared with the conventional method for manufacturing a color filter, the present embodiments have the following advantages. The organic black matrix is formed directly using a photo-mask so the pattern precision of the organic black matrix is enhanced. Furthermore, the present material of the black matrix is a resin-based composition replacing the conventional chromium and is environmentally friendly.

Other advantages and novel features will become more apparent from the following detailed description of the present invention, when taken in conjunction with the accompanying drawings.

BRIEF DESCRIPTION OF THE DRAWINGS

Many aspects of the present method can be better understood with reference to the following drawings. The components in the drawings are not necessarily drawn to scale, the emphasis instead being placed upon clearly illustrating the principles of the present invention. Moreover, in the drawings, like reference numerals designate corresponding parts throughout the several views.

Figure 1:
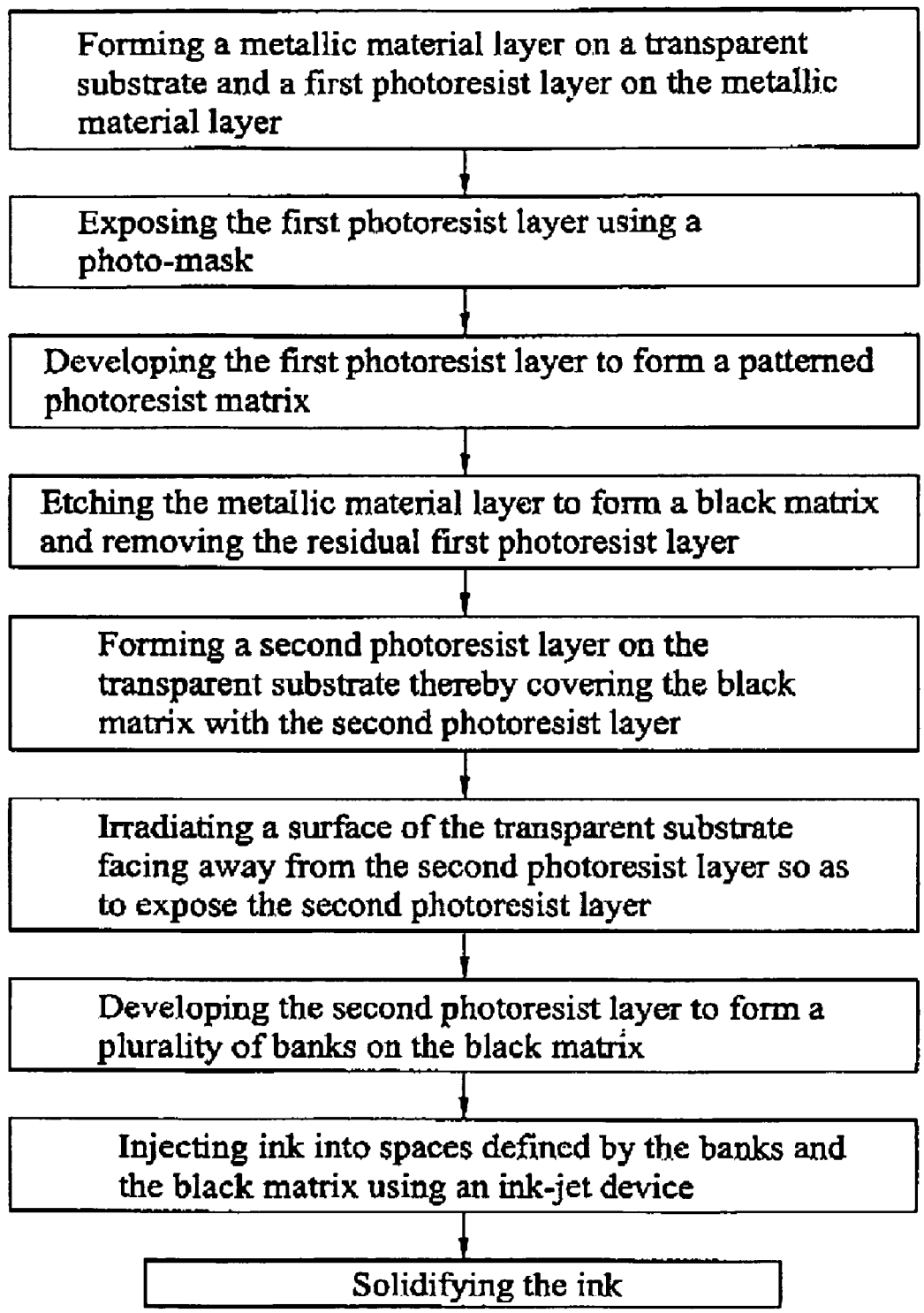
FIG. 1 is a flow chart of a conventional method for manufacturing a color filter.
Figure 2:
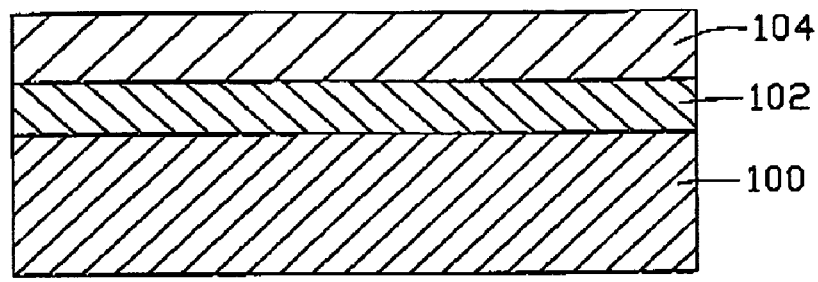
FIG. 2 is a schematic view of a metallic material layer and a first photoresist layer on a transparent substrate in a stage of a conventional method for manufacturing a color filter.
Figure 3:
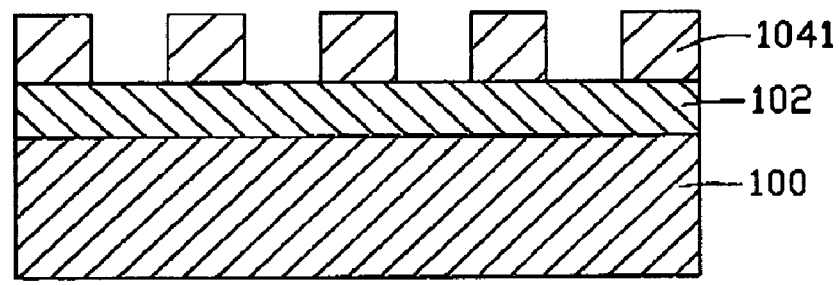
FIG. 3 is similar to FIG. 2, but showing a patterned photoresist layer formed on the metallic material layer in a subsequent stage of a conventional method for manufacturing a color filter.
Figure 4:
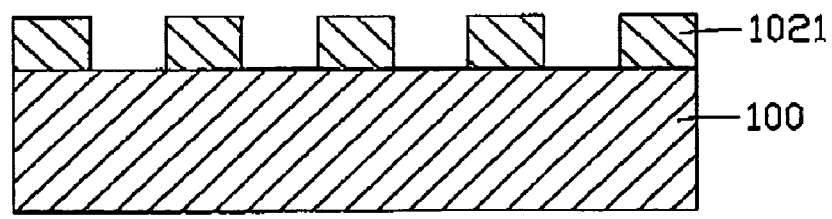
FIG. 4 is similar to FIG. 3, but showing a black matrix formed on the transparent substrate in a subsequent stage of a conventional method for manufacturing a color filter.
Figure 5:
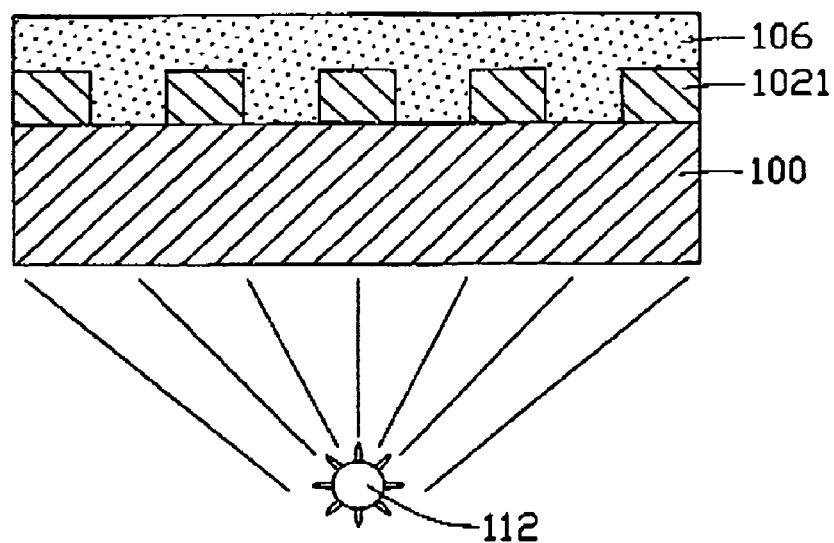
FIG. 5 is similar to FIG. 4, but showing a second photoresist layer on a black matrix and a transparent substrate in a subsequent stage conventional method for manufacturing a color filter.
Figure 6:
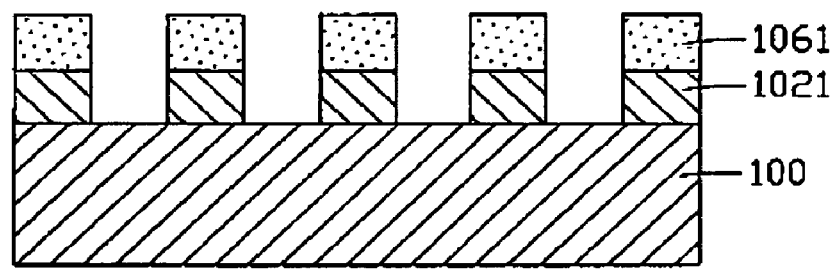
FIG. 6 is similar to FIG. 5, but showing a plurality of banks formed on the black matrix in a subsequent stage of a conventional method for manufacturing a color filter.
Figure 7:
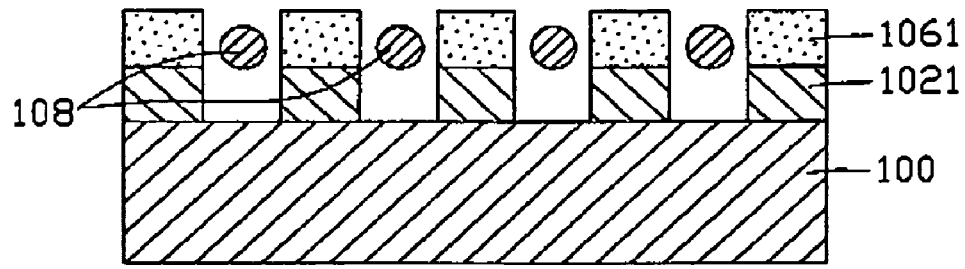
FIG. 7 is similar to FIG. 6, but showing ink-drops injected in spaces defined by banks and a black matrix in a subsequent stage of a conventional method for manufacturing a color filter.
Figure 8:
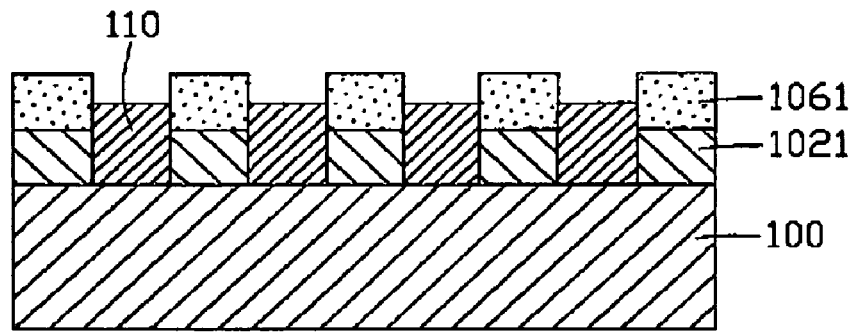
FIG. 8 is similar to FIG. 7, but showing the ink received in spaces defined by banks and a black matrix in a subsequent stage of a conventional method for manufacturing a color filter.
Figure 9:
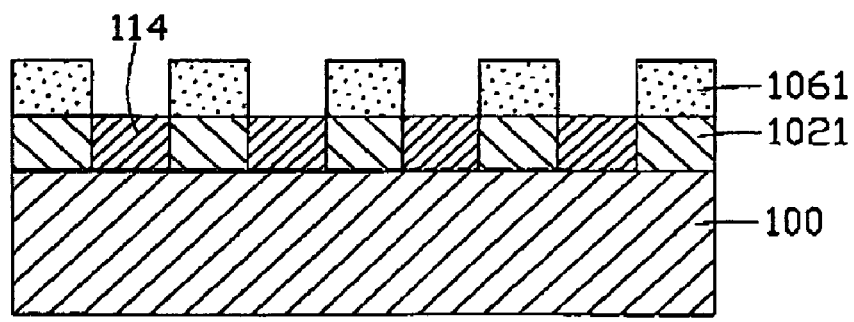
FIG. 9 is a schematic view of the ink solidified in spaces defined by banks and a black matrix in a subsequent stage of a conventional method for manufacturing a color filter.

Corresponding reference characters indicate corresponding parts throughout the drawings. The exemplifications set out herein illustrate at least one preferred embodiment of the present invention, in one form, and such exemplifications are not to be construed as limiting the scope of the invention in any manner.

DETAILED DESCRIPTION OF PREFERRED EMBODIMENTS

Reference will now be made to the drawings to describe preferred embodiments of the present methods for manufacturing a color filter, in detail.

Figure 10:
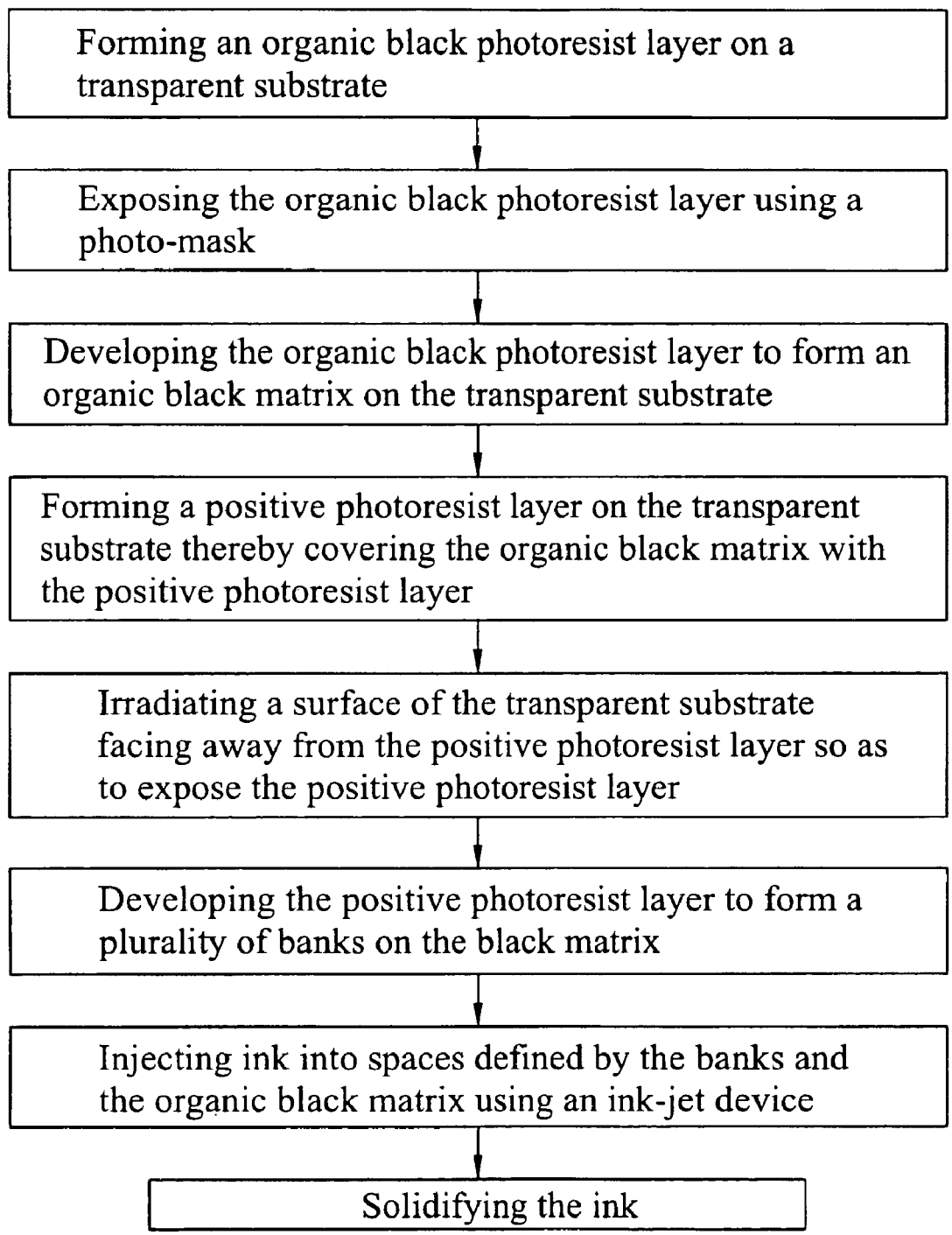
FIG. 10 is a flow chart of a method for manufacturing a color filter in accordance with a first preferred embodiment.

Referring to FIG. 10, a flow chart of a method for manufacturing a color filter in accordance with a first preferred embodiment is shown. The method mainly includes the steps of: forming an organic black photoresist layer on a transparent substrate; exposing the organic black photoresist layer using a photo-mask; developing the organic black photoresist layer to form an organic black matrix on the transparent substrate; forming a positive photoresist layer on the transparent substrate thereby covering the organic black matrix with the positive photoresist layer; irradiating a surface of the transparent substrate facing away from the positive photoresist layer so as to expose the positive photoresist layer; developing the positive photoresist layer to form a plurality of banks on the black matrix; injecting ink into spaces defined by the banks and the organic black matrix using an ink-jet device; and solidifying the ink.

With references of FIGS. 11 to 15, the method for manufacturing a color filter in accordance with the first preferred embodiment is described in more detail.

Figure 11:
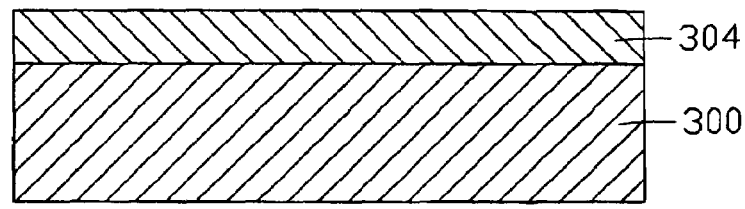
FIG. 11 is a schematic view of an organic black photoresist layer on a transparent substrate in a stage of a method for manufacturing a color filter in accordance with a first preferred embodiment.

Referring to FIG. 11, a transparent substrate 300, such as a glass substrate is provided. An organic black photoresist layer 304 is formed on the transparent substrate 300. The material of the organic black photoresist layer 304 generally is a resin-based composition. The resin-based composition may contain carbon black.

Figure 12:
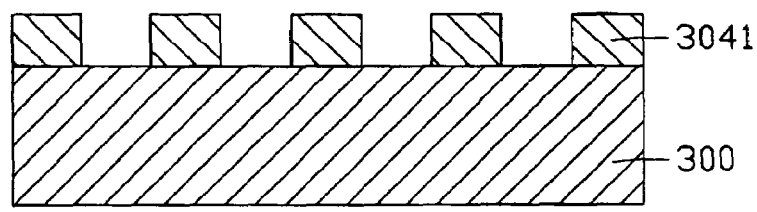
FIG. 12 is similar to FIG. 11, but showing an organic black matrix on a transparent substrate in a subsequent stage of a method for manufacturing a color filter in accordance with a first preferred embodiment.

Referring to FIG. 12, the organic black photoresist layer 304 is exposed using a photo-mask (not shown) and developed to form an organic black matrix 3041 on the transparent substrate 300. Therefore, the pattern of the photo-mask is transferred to the organic black matrix 3041.

Figure 13:
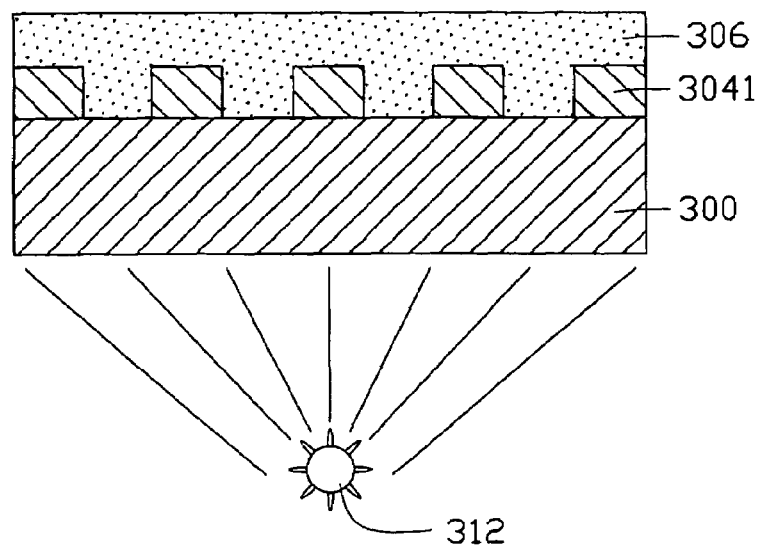
FIG. 13 is similar to FIG. 12, but showing a positive photoresist layer on a transparent substrate in a subsequent stage of a method for manufacturing a color filter in accordance with a first preferred embodiment.

Referring to FIG. 13, a positive photoresist layer 306 is formed on the transparent substrate 300 thereby covering the organic black matrix 3041 with the positive photoresist layer 306. Then a surface of the transparent substrate 300 facing away from the positive photoresist layer 306 is irradiated by an ultraviolet light source 312 so as to expose the positive photoresist layer 306. Here, the organic black matrix 3041 is utilized as a photo-mask to the positive photoresist layer 306.

Figure 14:
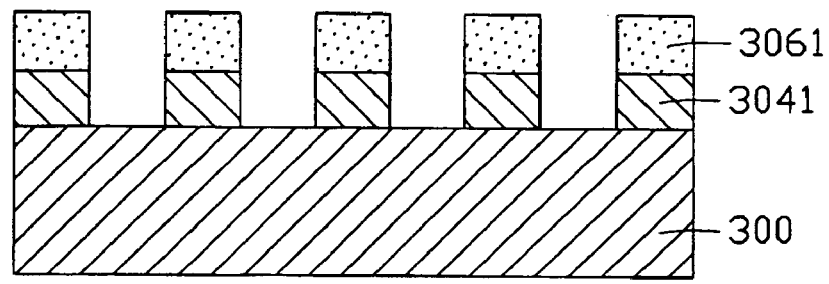
FIG. 14 is similar to FIG. 13, but showing a plurality of banks on an organic black matrix in a subsequent stage of a method for manufacturing a color filter in accordance with a first preferred embodiment.

Referring to FIG. 14, the positive photoresist layer 306 is developed to form a plurality of banks 3061 on the organic black matrix 3041. Spaces are defined by the banks 3061 and the organic black matrix 3041.

Figure 15:
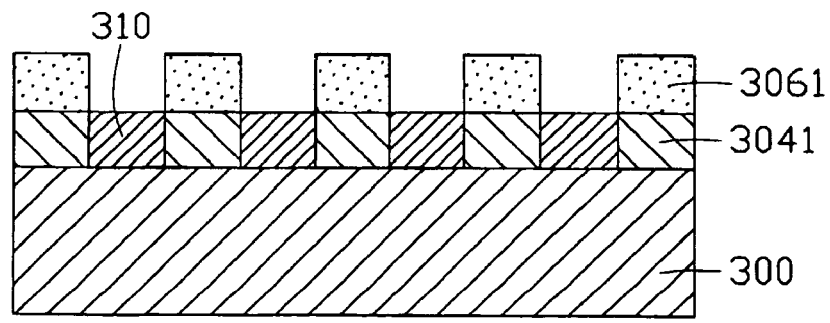
FIG. 15 is similar to FIG. 14, but showing color ink solidified in spaces defined by banks and an organic black matrix in a subsequent stage of a method for manufacturing a color filter in accordance with a first preferred embodiment.

Referring to FIG. 15, ink of a desired color is injected into the spaces defined by the banks 3061 and the organic black matrix 3041 using an ink-jet device (not shown), such as a thermal bubble ink-jet device or a piezoelectrical ink-jet device. Then the color ink in the spaces is solidified by a solidifying device (not shown), such as a heating device or a light-emitting device, to form flat color layers 310. The flat color layers 310 may be, for example, red. Correspondingly, other color layers, such as blue-color layers and green-color layers may be formed adjacent to the color layers 310. A heating device and a vacuum-pumping device can also be used for solidifying the ink in the spaces defined by the banks 3061 and the organic black matrix 3041.

Compared with conventional methods for manufacturing a color filter, the organic black matrix 3041 is formed directly using a photo-mask so that the precision of the organic black matrix 3041 is enhanced. Furthermore, the present material of the black matrix is a resin-based composition, which is environmentally friendly, in absence of harmful chromium.

Figure 16:
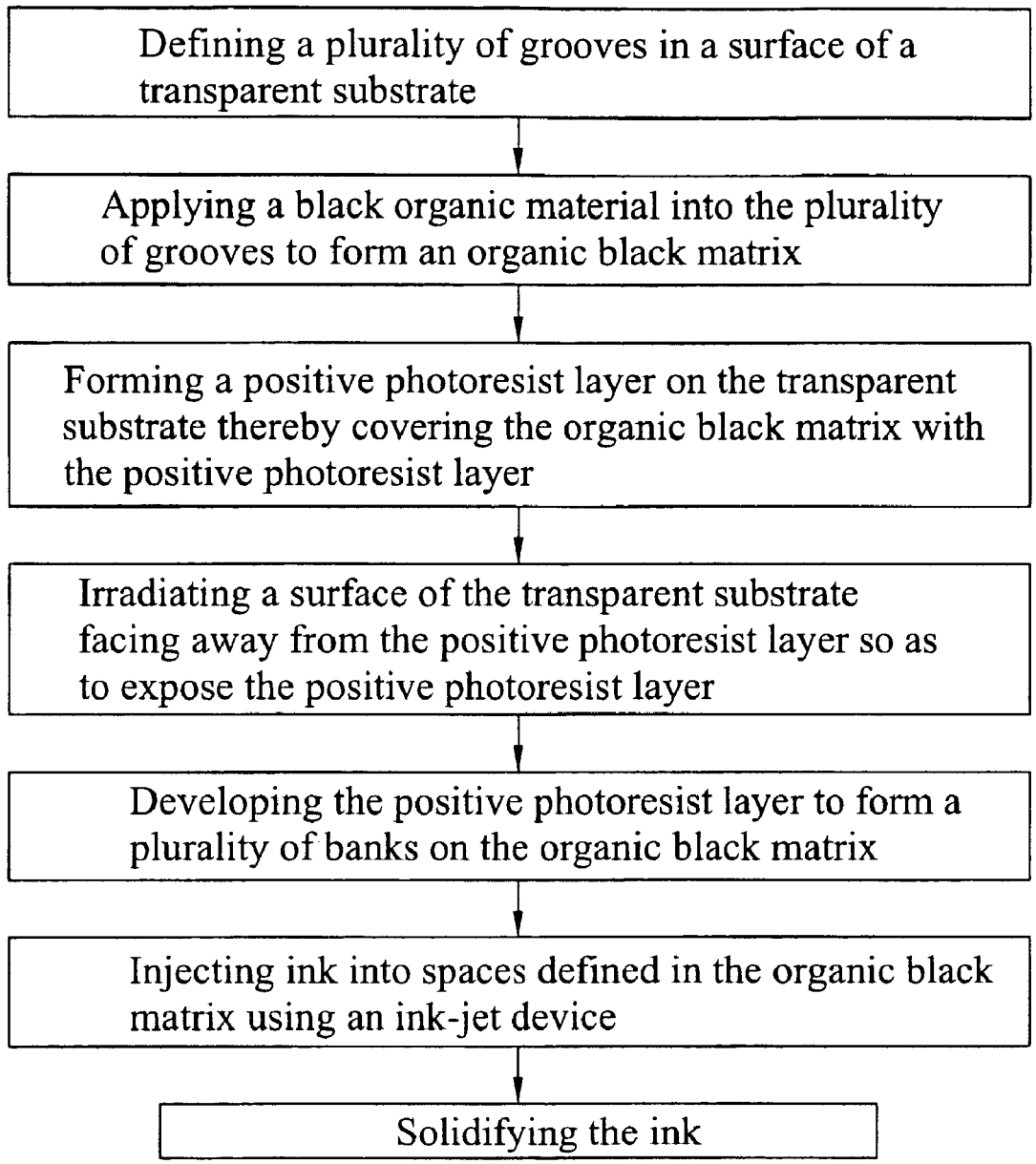
FIG. 16 is a flow chart of a method for manufacturing a color filter in accordance with a second preferred embodiment.

Referring to FIG. 16, a flow chart of a method for manufacturing a color filter, in accordance with a second preferred embodiment, is shown. The method mainly includes the steps of: defining a plurality of grooves in a surface of a transparent substrate; applying a black organic material into the plurality of grooves to form an organic black matrix; forming a positive photoresist layer on the transparent substrate thereby covering the organic black matrix with the positive photoresist layer; irradiating a surface of the transparent substrate facing away from the positive photoresist layer so as to expose the positive photoresist layer; developing the positive photoresist layer to form a plurality of banks on the organic black matrix; injecting ink into spaces defined by the banks and the organic black matrix using an ink-jet device; and solidifying the ink.

With reference to FIGS. 17 to 21, the method for manufacturing a color filter in accordance with the second preferred embodiment is described in more detail below.

Figure 17:
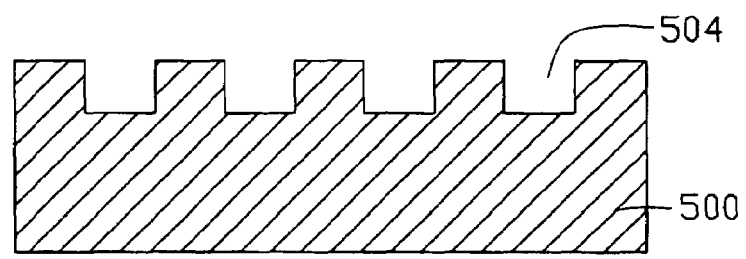
FIG. 17 is a schematic view of a plurality of grooves defined in a transparent substrate in a stage of a method for manufacturing a color filter in accordance with a second preferred embodiment.

Referring to FIG. 17, a transparent substrate 500, such as a glass substrate, is provided. A plurality of grooves 504 is defined in a surface of the transparent substrate 500 by a lasing process, a sand blasting process or an etching process using a photo-mask (not shown). Also, the plurality of grooves 504 can be defined by a laser process or a sand blasting process with the help of an accurate positioning mechanism such as that used in a mask aligner.

Figure 18:
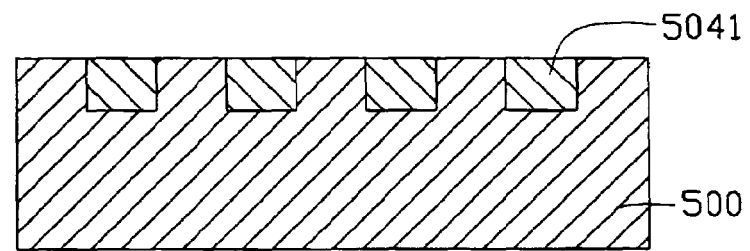
FIG. 18 is similar to FIG. 17, but showing an organic black matrix formed in grooves in a method for manufacturing a color filter in accordance with a subsequent stage of a second preferred embodiment.

Referring to FIG. 18, an organic material, such as a resin-based composition is applied into the plurality of grooves 504 by an injection device(not shown). An organic black matrix 5041 is then formed. The resin-based composition may contain carbon black.

Figure 19:
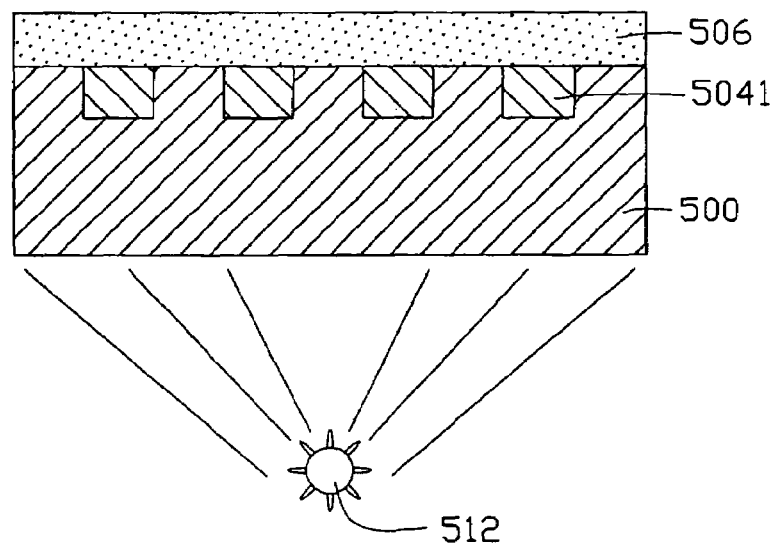
FIG. 19 is similar to FIG. 18, but showing a positive photoresist layer on a transparent substrate in a subsequent stage of a method for manufacturing a color filter in accordance with a second preferred embodiment.

Referring to FIG. 19, a positive photoresist layer 506 is formed on the transparent substrate 500 thereby covering the organic black matrix 5041 with the positive photoresist layer 506. Then a surface of the transparent substrate 500 facing away from the positive photoresist layer 506 is irradiated by an ultraviolet light source 512 so as to expose the positive photoresist layer 506. Here, the organic black matrix 5041 is utilized as a photo-mask to the positive photoresist layer 506.

Figure 20:
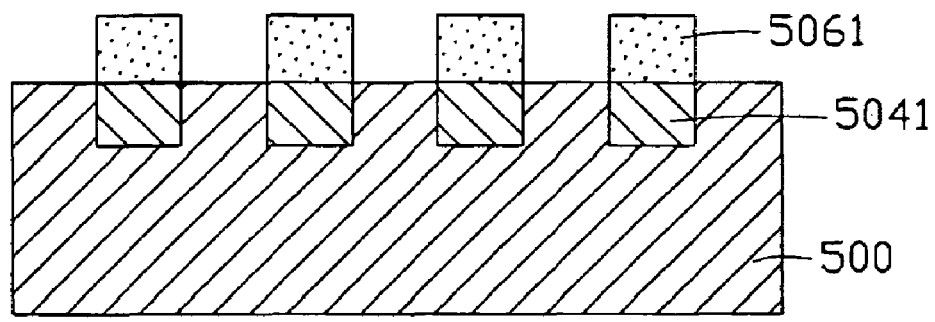
FIG. 20 is similar to FIG. 19, but showing a plurality of banks formed on the black matrix in a subsequent stage of a method for manufacturing a color filter in accordance with a second preferred embodiment.

Referring to FIG. 20, the positive photoresist layer 506 is developed to form a plurality of banks 5061 on the organic black matrix 5041. Preferably, the banks 5061 are not transparent to visible light. Spaces are defined by the banks 5061 and the organic black matrix 5041.

Figure 21:
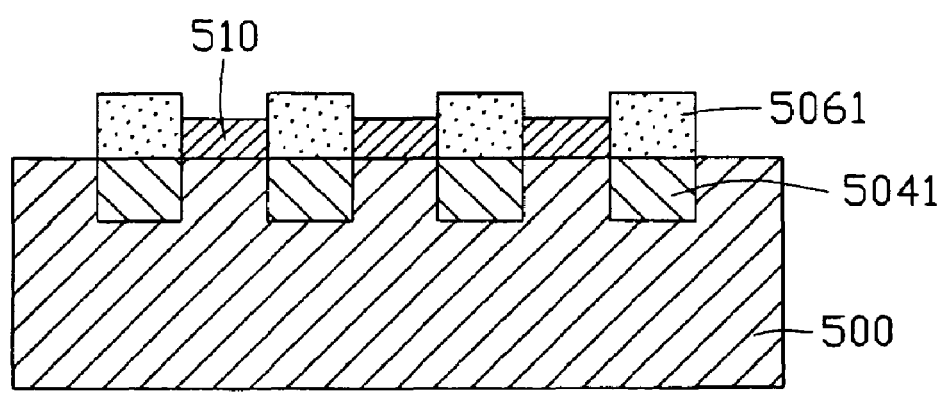
FIG. 21 is similar to FIG. 20, but showing color ink solidified in spaces defined by banks and an organic black matrix in a subsequent stage of a method for manufacturing a color filter in accordance with a second preferred embodiment.

Referring to FIG. 21, ink of a desired color is injected into the spaces defined by the banks 5061 and the organic black matrix 5041 using an ink-jet device (not shown), such as a thermal bubble ink-jet device or a piezoelectrical ink-jet device. Then the ink in the spaces is solidified by a solidifying device (not shown), such as a heating device or a light-emitting device, to form flat color layers 510. The flat color layers 510 may be for example, red. Correspondingly, other color layers, such as blue-color layers and green-color layers may be formed adjacent to the color layers 510. A heating device and a vacuum-pumping device can also be used for solidifying the ink in the spaces defined by the banks 5061 and the organic black matrix 5041.

The advantages of the method for the second preferred embodiment are the same as that of the method for manufacturing a color filter according with the first preferred embodiment. Moreover, because the ink in the spaces defined by the banks and the organic black matrix is totally separated by the banks, mixture and blurring of different colored ink is avoided even if pores existed in the organic black matrix 5041.

Figure 22:
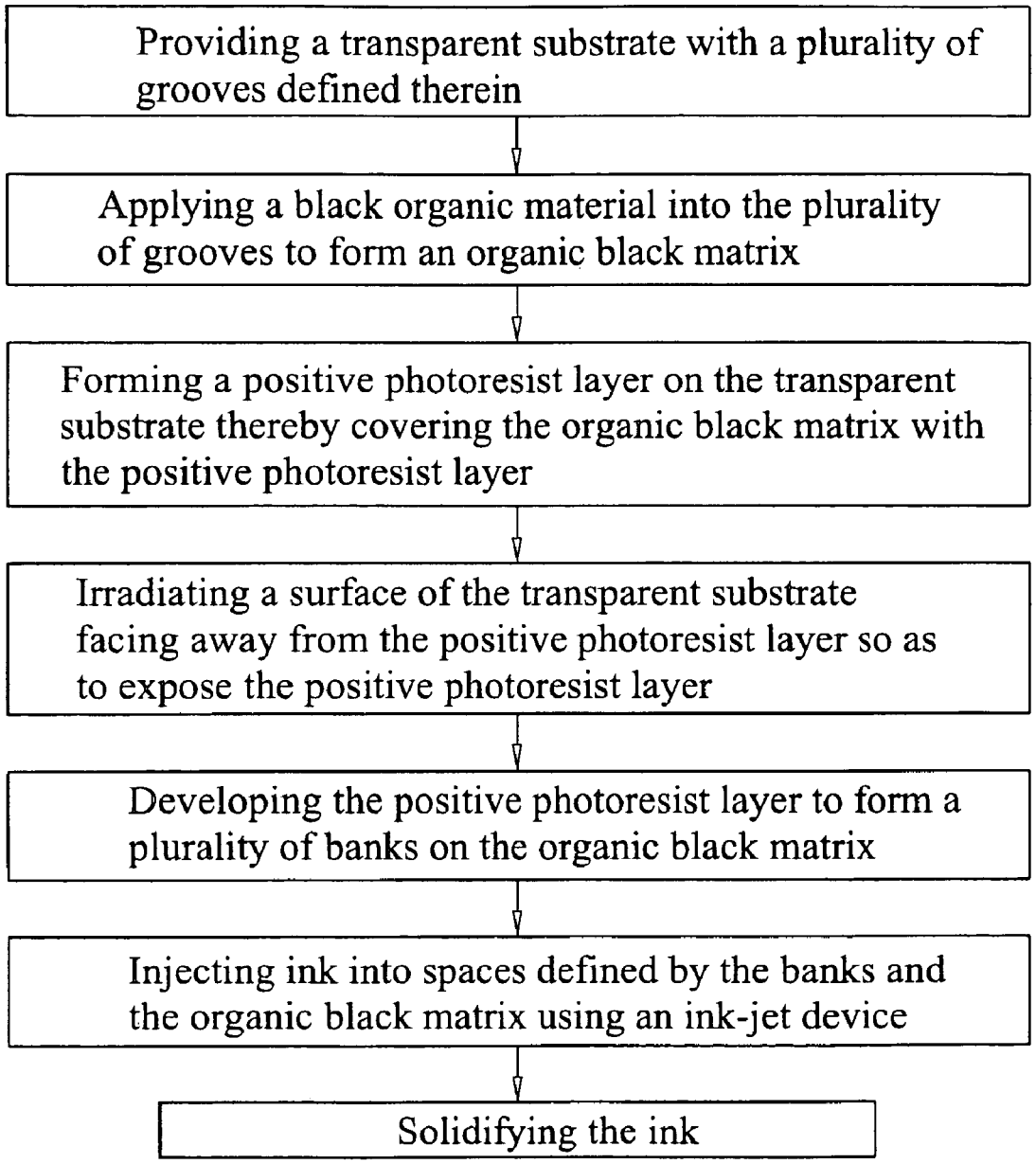
FIG. 22 is a flow chart of a method for manufacturing a color filter in accordance with a third preferred embodiment.

Referring to FIG. 22, a flow chart of a method for manufacturing a color filter, in accordance with a third preferred embodiment, is shown. The method mainly includes the steps of: providing a transparent substrate with a plurality of grooves defined therein; applying a black organic material into the plurality of grooves to form an organic black matrix; forming a positive photoresist layer on the transparent substrate thereby covering the organic black matrix with the positive photoresist layer; irradiating a surface of the transparent substrate facing away from the positive photoresist layer so as to expose the positive photoresist layer; developing the positive photoresist layer to form a plurality of banks on the organic black matrix; injecting ink into spaces defined by the banks and the organic black matrix using an ink-jet device; and solidifying the ink.

More-detail steps and advantages of the method for manufacturing a color filter according to the third preferred embodiment is similar to those of the method for manufacturing a color filter according to the second preferred embodiment. Those skilled in the technical field can refer to the method for manufacturing a color filter according to the second preferred embodiment.

It is to be understood that the above-described embodiment is intended to illustrate rather than limit the invention. Variations may be made to the embodiment without departing from the spirit of the invention as claimed. The above-described embodiments are intended to illustrate the scope of the invention and not restrict the scope of the invention.

What is claimed is:

1. A method for manufacturing a color filter, comprising the steps of:

defining a plurality of grooves in a surface of a transparent substrate;

applying a black organic material into the plurality of grooves to form an organic black matrix;

forming a positive photoresist layer on the transparent substrate thereby covering the organic black matrix with the positive photoresist layer;

irradiating a surface of the transparent substrate facing away from the positive photoresist layer so as to expose the positive photoresist layer;

developing the positive photoresist layer to form a plurality of banks on the organic black matrix;

injecting ink into spaces defined by the banks and the organic black matrix using an ink-jet device; and solidifying the ink.

2. The method for manufacturing the color filter of claim 1, wherein the grooves are defined by using a process chosen from the group consisting of a laser process, a sand blasting process, and an etching process using a photo-mask.

3. The method for manufacturing the color filter of claim 1, wherein the grooves are defined by a laser process or a sand blasting process using an accurate positioning mechanism.

4. The method for manufacturing the color filter of claim 1, wherein the ink-jet device is a thermal bubble ink-jet device or a piezoelectrical ink-jet device.

5. The method for manufacturing the color filter of claim 1, wherein the ink is solidified by a heating device.

6. The method for manufacturing the color filter of claim 1, wherein the ink is solidified by a heating device and a vacuum-pumping device.

7. The method for manufacturing the color filter of claim 1, wherein the ink is solidified by a light-emitting device.

8. The method for manufacturing the color filter of claim 1, wherein the transparent substrate is a glass substrate.

9. The method for manufacturing the color filter of claim 1, wherein the organic material is a resin-based composition containing carbon black.

10. The method for manufacturing the color filter of claim 1, wherein the surface of the transparent substrate facing away from the positive photoresist layer is irradiated by an ultraviolet light-emitting device.

* * * * *